(12) United States Patent
Lee et al.

(10) Patent No.: US 7,588,984 B2
(45) Date of Patent: Sep. 15, 2009

(54) METHOD TO DEFINE A TRANSISTOR GATE OF A DRAM AND THE TRANSISTOR GATE USING SAME

(75) Inventors: Yu-Pi Lee, Taoyuan (TW); Shian-Jyh Lin, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 445 days.

(21) Appl. No.: 11/431,588

(22) Filed: May 11, 2006

(65) Prior Publication Data
US 2007/0264788 A1    Nov. 15, 2007

(51) Int. Cl.
*H01L 21/336* (2006.01)
(52) U.S. Cl. .................. 438/259; 438/370; 257/301; 257/E27.092; 257/E29.346
(58) Field of Classification Search .......... 438/259, 438/270, 243; 257/301, E27.092, E29.346
See application file for complete search history.

(56) References Cited

U.S. PATENT DOCUMENTS

2005/0277246 A1* 12/2005 Kirkpatrick et al. ......... 438/232
2007/0032032 A1* 2/2007 Heineck et al. ............. 438/386

* cited by examiner

*Primary Examiner*—Asok K Sarkar
*Assistant Examiner*—Julia Slutsker
(74) *Attorney, Agent, or Firm*—Bacon & Thomas, PLLC (57) ABSTRACT

A method to determine the predetermined location of a transistor gate of a dynamic random access memory (DRAM). A trench capacitor is respectively provided in a silicon substrate at the two sides of the gate, along the direction of a bit line. The method is to first form a patterned layer of silicon nitride over the substrate so that at the location where the two trench capacitors are desired to be built, the substrate is exposed; then to build the two trench capacitors at the location of the exposed substrate. Form a layer of silicon oxide to cover the capacitors and make the layer of silicon oxide and the layer of silicon nitride at the same level. Layer of silicon nitride is removed afterwards, and a polysilicon layer is conformably formed on the substrate. A BF2 ion implantation is performed twice at different tilt angles on the polysilicon layer in order to define an undoped area between the two trench capacitors. Then remove the undoped area of the polysilicon layer so that part of the silicon substrate is exposed to serve as the predetermined location of transistor gate.

12 Claims, 6 Drawing Sheets

METHOD TO DEFINE A TRANSISTOR GATE OF A DRAM AND THE TRANSISTOR GATE USING SAME

FIELD OF THE INVENTION

The present invention relates to a manufacturing process of a semiconductor integrated circuit transistor gate, especially to a method for forming an elongated channel transistor gate with a recess in a dynamic random access memory (DRAM).

BACKGROUND OF THE INVENTION

A memory cell of typical DRAM is mainly composed of a transistor, which has a gate, a source, and a drain, and a capacitor. To reduce the area used for capacitors and to increase capacitivity, trench capacitors have been extensively used in DRAM design.

Figure 1A:
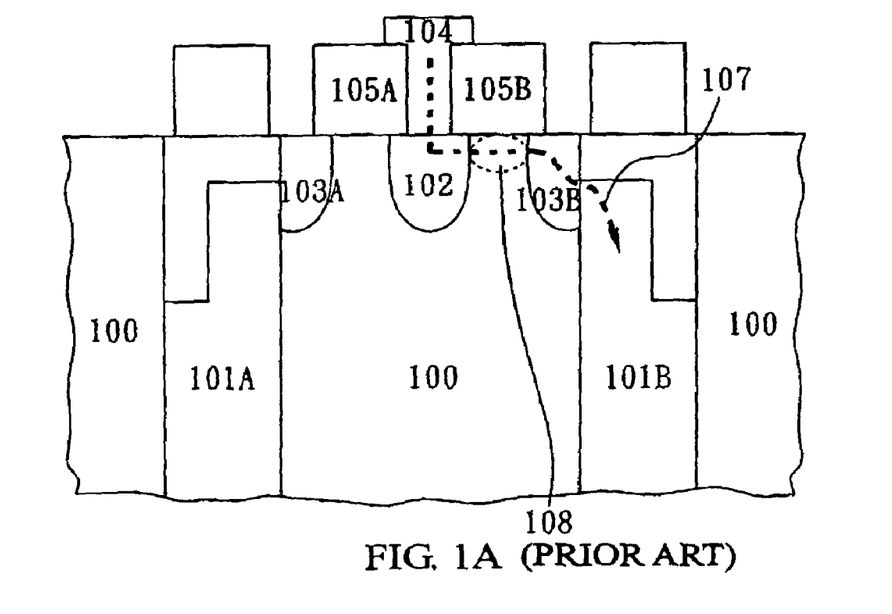
FIGS. 1A and 1B are the schematic cross-sectional views of the memory cells of prior DRAM.

FIG. 1A illustrates a schematic cross-sectional view of prior art DRAM memory cells using trench capacitors, wherein it comprises a substrate 100, trench capacitor electrodes 101A and 101B (only the upper parts are shown), a source 102, drains 103A and 103B, a bit line contact structure 104, and gates 105A and 105B. Thus two memory cells are that formed (one is on the left side and the other is on the right side) and share source 102, and bit line contact structure 104 is formed between the two gates 105A and 105B. Bit line contact structure 104 additionally connects to a bit line (not shown) and gates 105A and 105B furthermore connects to a word line (not shown), respectively, wherein said bit line is constructed in a upper structure and parallel to the direction that said two memory cells disposed; said word line is constructed in another upper structure and perpendicular to said bit line. During the operation, when apply voltage onto the related bit line and word line to access the memory cell on the right side, the current flows through bit line contact structure 104, source 102, gate channel 108, drain 103B, and then enters into capacitor electrode 101B, shown as current direction 107.

Figure 1B:
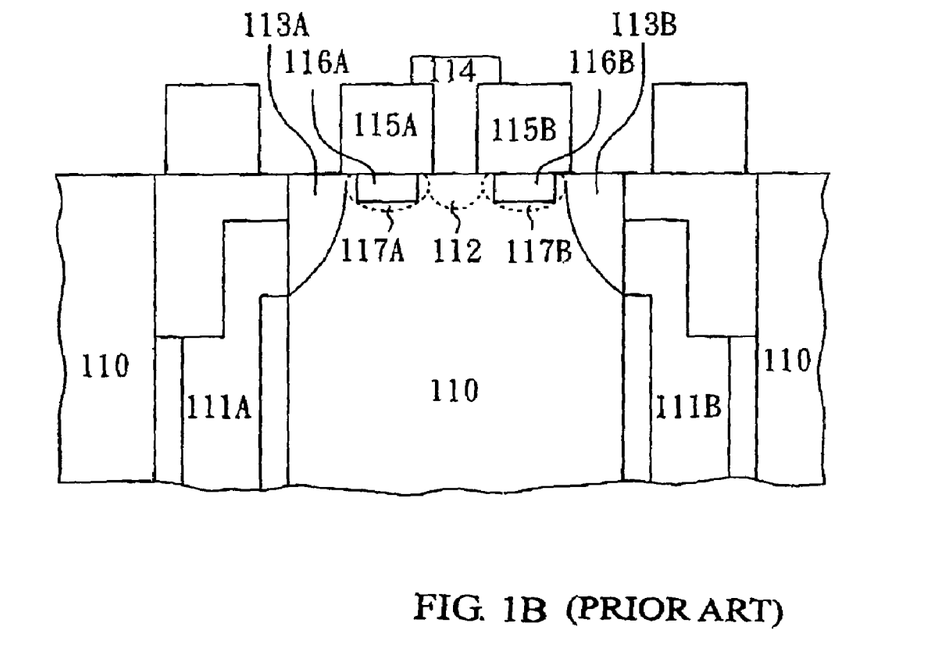

Nevertheless, because the size of integrated circuit components continues decreasing, thereby the length of transistor gate channel is becoming shorter, which can easily cause the occurrences of short channel effects such as drop in threshold voltage and increase in current leakage from drain to source, etc. Therefore in order to improve this problem the design of elongated channel transistor gate with a recess has been developed in prior arts. As illustrated in FIG. 1B, in which it comprises substrate 110, trench capacitor electrodes 111A and 111B (only upper parts are shown), source 112, drains 113A and 113B, bit line contact structure 114, and gates 115A and 115B. Gates 115A and 115B respectively have recesses 116A and 116B formed in substrate 110, thereby channels 117A and 117B formed along recesses 116A and 116B during the operation have longer lengths.

Usually the location of transistor gate is defined by photolithography, which aligns and transfers the patterns on the mask to the thin film layer or the silicon under photoresist then further produces the gate. However, as the component size continues decreasing, the problem related to overlay error between multiple layers in photolithography is becoming serious, and it is thus more unlikely to produce gates by accurately defining the location of the reducing size of transistor gate using photolithography technique. Thus, a method is needed for a solution to overcome the problems stated above.

SUMMARY OF THE INVENTION

An objective of the present invention is to provide a method for forming a semiconductor transistor gate, which defines the predetermined location of a transistor gate by means of ion implantation at tilt angles and self-alignment without using masks, thereby to produce the gates by accurately define the predetermined location of transistor gates as reducing size.

The present invention provides a method to determine the predetermined location of a transistor gate of a dynamic random access memory (DRAM), wherein a trench capacitor is provided in a substrate at the two sides of the gate, respectively along the direction of a bit line, said method comprising: first forming a patterned first mask layer over the substrate so that at the location where the two trench capacitors are to be built, said substrate is exposed; building said two trench capacitors at the location of said exposed substrate; forming a first dielectric layer to cover said two trench capacitors and make said first dielectric layer and said first mask layer at the same level; removing said first mask layer; conformably forming a second mask layer on the substrate; performing an ion implantation twice at tilt angles on said second mask layer to define an undoped area between said two trench capacitors; and removing said undoped area of said second mask layer so that part of the substrate is exposed to serve as the predetermined location of the transistor gate.

The present invention further provides a method for forming a transistor gate of a DRAM using the method previously described, wherein after removing the undoped area of the second mask layer, said method further comprising: forming a recess in the substrate corresponding to said undoped area; removing the second mask layer; making the first dielectric layer and the substrate at the same level; forming a second dielectric layer over the bottom and sides of said recess; filling said recess having said second dielectric layer with a first conductive layer and make the first conductive layer and the substrate at the same level; and forming a second conductive layer on the first conductive layer, said second and first conductive layers together forming said transistor gate.

The present invention further provides a dynamic random access memory (DRAM), wherein a trench capacitor is disposed in a substrate at the two sides of a transistor gate, respectively along a direction of a bit line, the distances between said transistor gate and said two trench capacitors being different, which is able to improve the process window of subsequent bit line contact plug manufacturing process.

BRIEF DESCRIPTION OF THE DRAWINGS

Relevant embodiments of the present invention will be described in detail below with reference to the accompanying drawings, in which.

DETAIL DESCRIPTION OF THE PREFERRED EMBODIMENT

An embodiment of the present invention will be described in detail with reference to the accompanying drawings.

FIGS. 2A to 2I are illustrating the schematic cross-sectional views of each step of a transistor gate of DRAM formed in accordance with the present invention.

Figure 2A:
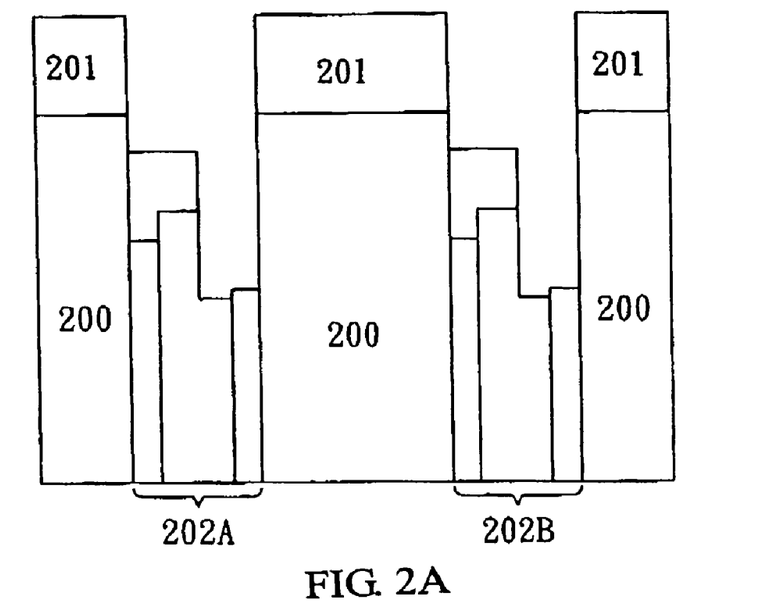
FIGS. 2A to 2I are the schematic cross-sectional views of each step of the method for forming a transistor gate of DRAM in accordance with the present invention, respectively.

FIG. 2A first provides a substrate 200 (such as a silicon substrate), on which covered by a patterned mask layer 201 using, for example, deposition and etching methods, said mask layer 201 can be silicon nitride. To expose the substrate where the location (not shown in figures) is desired to form the trench capacitors, and to form two trench capacitors 202A and 202B using the common method in the exposed substrate, said transistor gate will be created in between trench capacitors 202A and 202B, and said gate and trench capacitors 202A and 202B are arranged in parallel to the subsequent formed bit line direction.

Figure 2B:
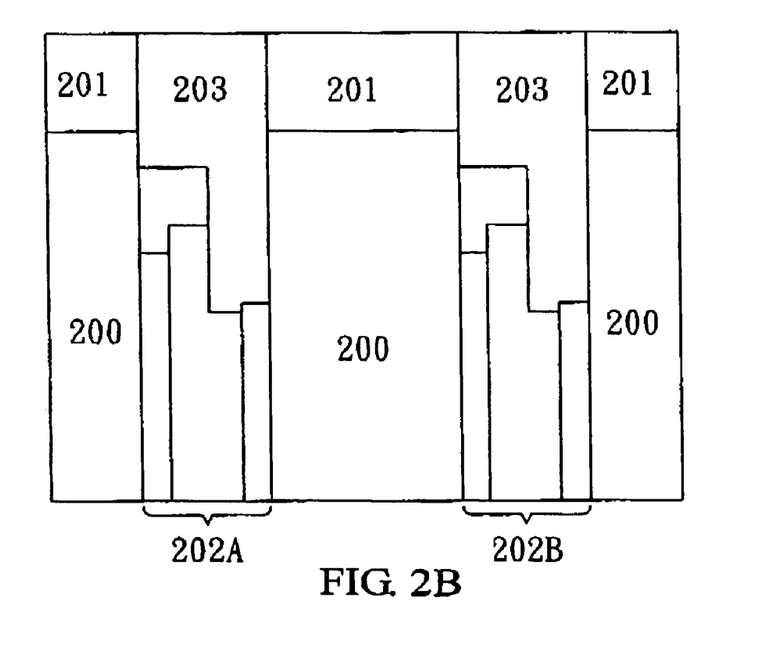

Then it follows a dielectric layer 203 that can be made of silicon oxide, after it is used to cover up on trench capacitors 202A and 101B and mask layer 201 using such as deposition method, the chemical-mechanical polishing (CMP) is implemented, as shown in FIG. 2B; this process is to make dielectric layer 203 and mask layer 201 at the same level and to expose mask layer 201.

Figure 2C:
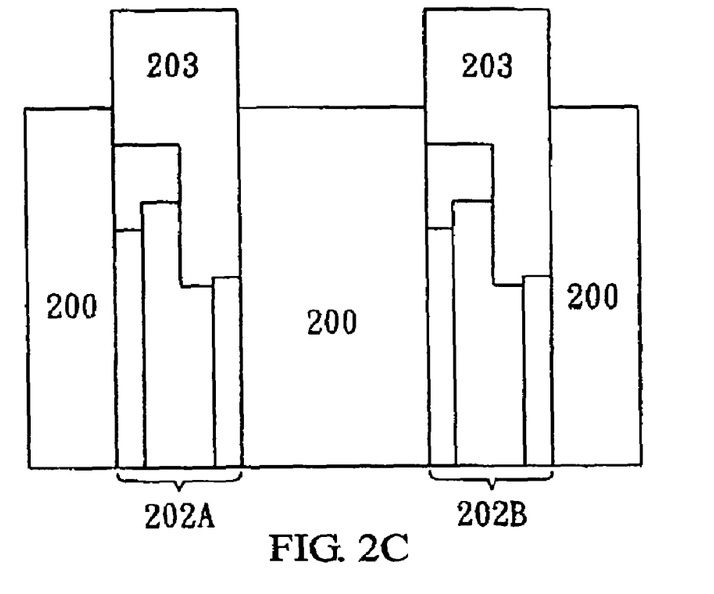

In FIG. 2C mask layer 201 can be removed by etching (e.g. using H3PO4) and left protruded dielectric layer 203 for the subsequent steps of ion implantation at tilt angles.

Figure 2D:
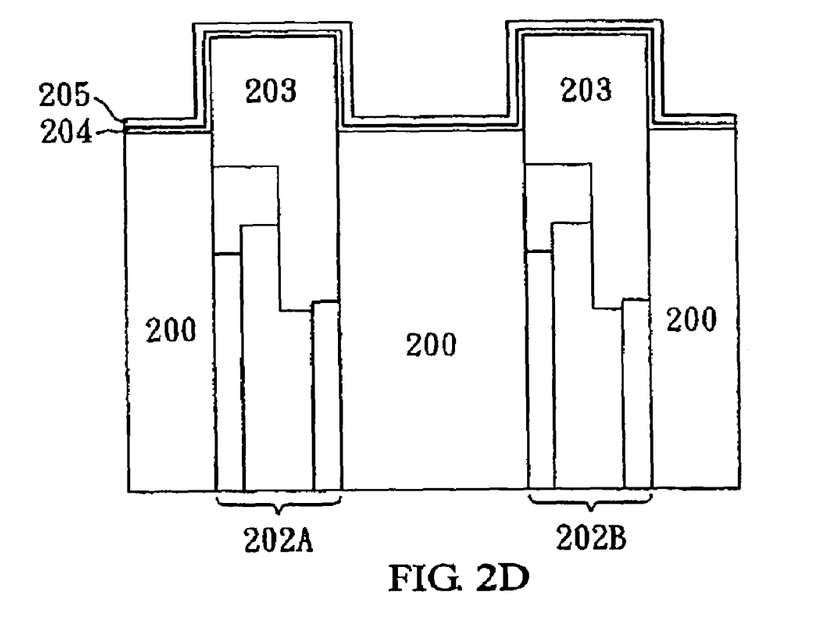

As illustrated in FIG. 2D, forming a protective layer 204 (e.g. silicon nitride) then a mask layer 205 (e.g. polysilicon layer) on the surface of overall structure, protective layer 204 is to prevent the diffusing of mask layer 205, formed with polysilicon, to substrate 200 and dielectric layer 203. Then before performing the steps of ion implantation, the main circuit that is desired to be protected can be covered by a photoresist layer (figure not shown).

Figure 2E:
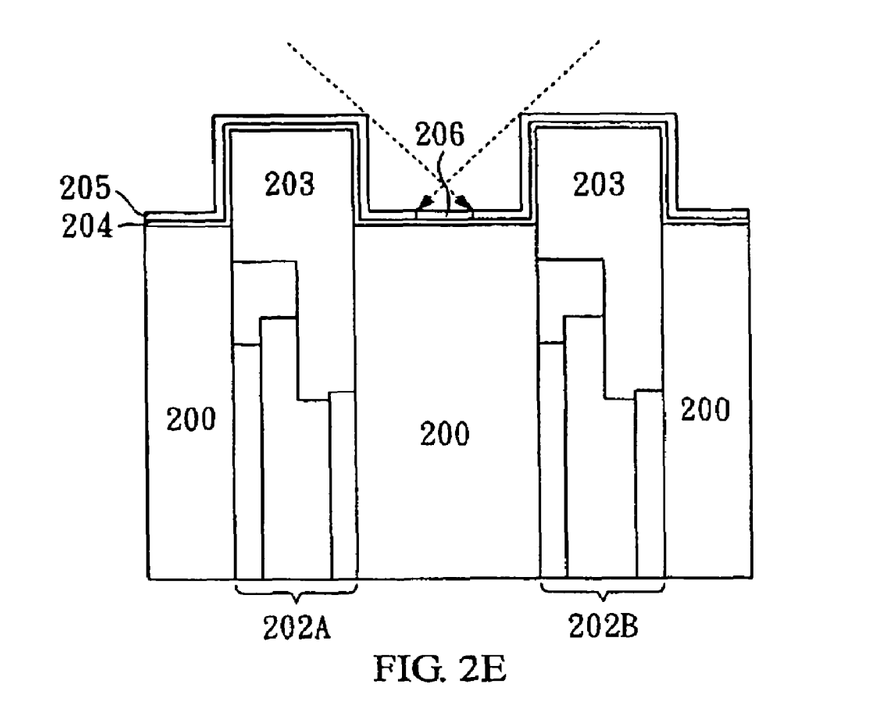

Next, perform ion implantation at tilt angles, as shown in FIG. 2E, to define the undoped area 206 on mask layer 205 between said two trench capacitors 202A and 202B, silicon oxide can be formed by the oxidation using BF2 ion implantation when mask layer 205 is made of polysilicon.

In such embodiment, in practical testing, when the design rule of the transistor is 60 nm, a thickness of 130 nm that the dielectric layer 203 relative to the surface of substrate 200 can be projected, and the ion implantation at tilt angles relative to the substrate can be performed twice at angles 38° and 40° for forming the undoped area 206, from which the distances between said two trench capacitors 202A and 202B are different. When the design rule of the transistor is 90 nm, a thickness of 130 nm that the dielectric layer relative to the surface of substrate 200 can be projected, and the ion implantation at tilt angles relative to the substrate can be performed twice at angles 46° and 48°.

Figure 2F:
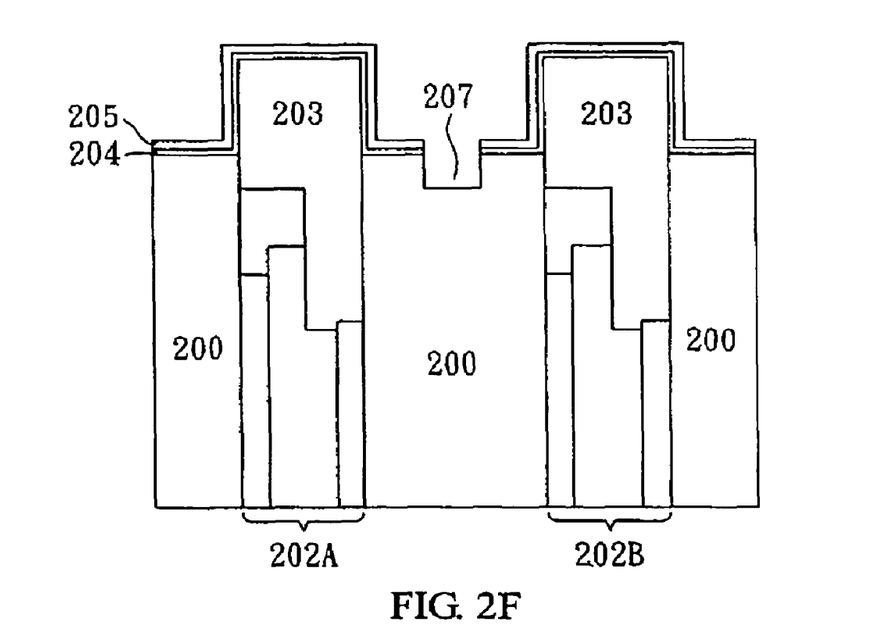

Then, after removing the undoped area 206 and corresponding protective layer 204 with NH4OH etching, further the recess 207 can be formed by etching (e.g. HBr) in corresponding substrate 200, as shown in FIG. 2F.

Figure 2G:
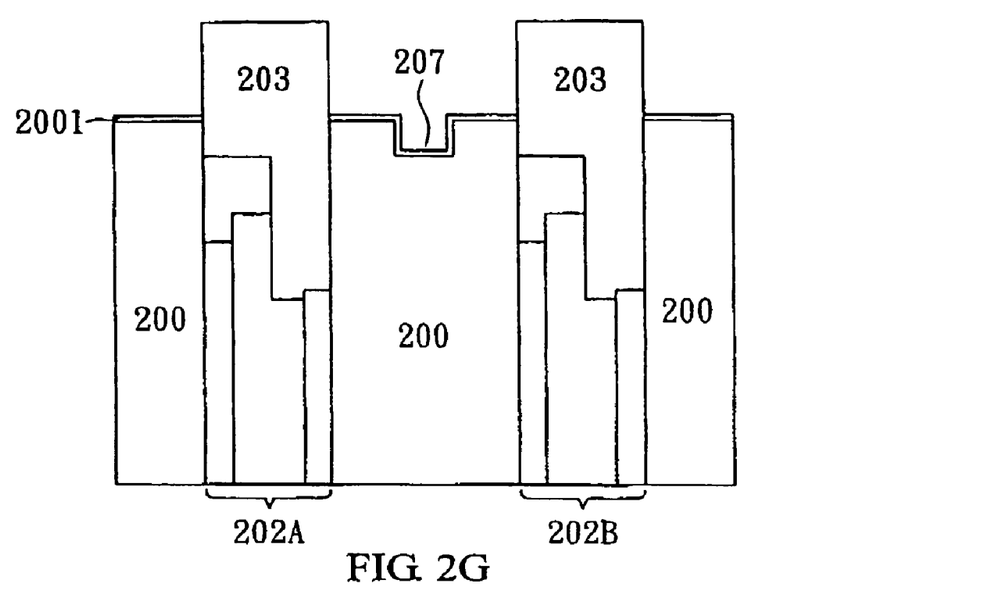

In FIG. 2G, ion implanted mask layer 205 and corresponding protective layer 204 are removed by, for example, BHF etching for exposing a part of substrate 200, and a thin oxide layer 2001 on the exposed substrate 200 is formed by e.g. thermal oxide method and provided as the sacrificial layer for the subsequent processes.

Figure 2H:
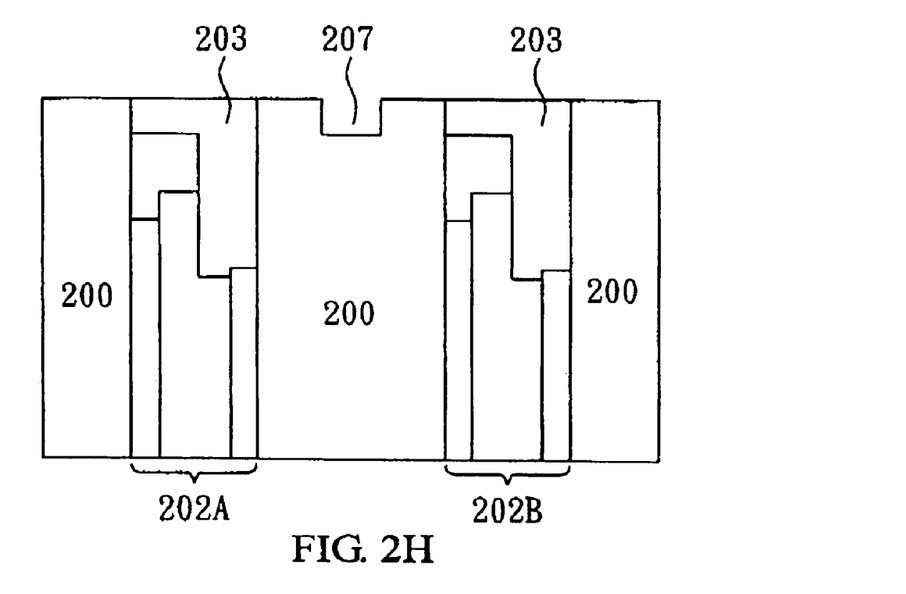

After that, implementing Chemical-Mechanical Polishing (CMP) to make dielectric layer 203 and substrate 200 at the same level, this process at the same time also removes thin oxide layer 2001 that is used as the sacrificial layer, as illustrated in FIG. 2H.

Figure 2I:
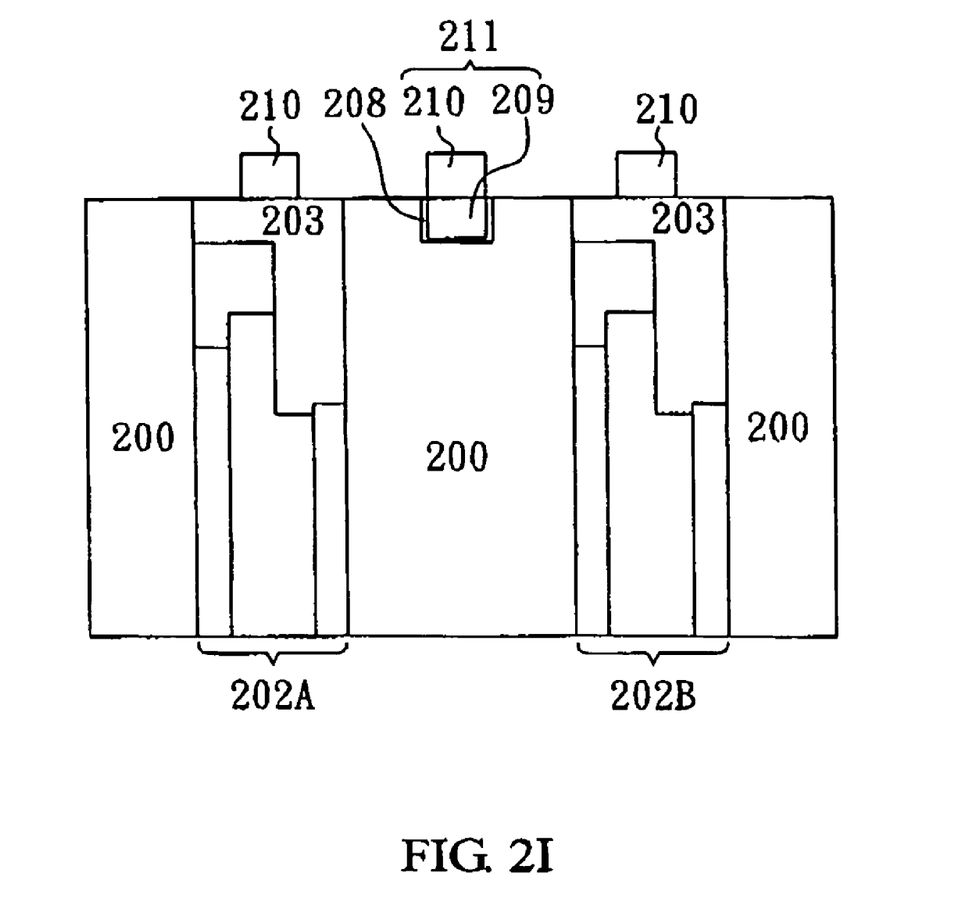

On the bottom and the sides of recess 207, a dielectric layer 208 (e.g. silicon oxide) is formed by, for example, deposition method; into the recess 207 with the dielectric layer 208, conductive layer 209 is filled, and the conductive layer 209 can be made of polysilicon and on which can a conductive layer 210 be formed by, for example, deposition method; conductive layer 210 together with conductive layer 209 form a transistor gate 211, the completed structure is as shown in FIG. 2I.

According to the description above, the present invention can accurately define the predetermined location of transistor gate by using the self-aligned method of ion implantation at tilt angles to produce the gate, thereby the problem that it is unable to accurately define the predetermined location of the gate and to produce the gate because the photolithography is effected by the characteristics of optical component while the component size is decreasing, can be solved.

While the embodiment of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

We claim:

1. A method to determine the predetermined location of a transistor gate of a dynamic random access memory (DRAM), wherein two trench capacitors are provided in a substrate at two sides of the gate, respectively along the direction of a bit line, said method comprising:

forming a patterned first mask layer over the substrate so that at a location where the two trench capacitors are to be built, said substrate is exposed;

building said two trench capacitors at the location of said exposed substrate;

forming a first dielectric layer to cover said two trench capacitors and make said first dielectric layer and said first mask layer at the same level;

removing said first mask layer;

conformably forming a second mask layer on the substrate;

performing an ion implantation twice at tilt angles on said second mask layer to define an undoped area between said two trench capacitors, wherein said ion implantation is performed twice at different tilt angles relative to the substrate, thereby the distances to said two trench capacitors from the undoped area are different; and removing said undoped area of said second mask layer so that part of the substrate is exposed to serve as the predetermined location of the transistor gate.

2. The method according to claim 1, wherein said first mask layer is made of silicon nitride.

3. The method according to claim 1, wherein said first dielectric layer is made of silicon oxide.

4. The method according to claim 1, wherein said second mask layer is made of polysilicon.

5. The method according to claim 4, wherein BF2 ions are used for said ion implantation, thereby the polysilicon becomes silicon oxide through oxidation.

6. The method according to claim 4, wherein the removing of said undoped area of said second mask layer is implemented by NH4OH etching.

7. The method according to claim 1, wherein said ion implantation is performed twice at same tilt angle relative to the substrate, thereby the distances to said two trench capacitors from the undoped area are the same.

8. A method for forming a transistor gate of a DRAM, wherein two trench capacitors are provided in a substrate at two sides of the gate, respectively along the direction of a bit line, said method comprising:

forming a patterned first mask layer over the substrate so that at a location where the two trench capacitors are to be built, said substrate is exposed;

building said two trench capacitors at the location of said exposed substrate;

forming a first dielectric layer to cover said two trench capacitors and make said first dielectric layer and said first mask layer at the same level;

removing said first mask layer;

conformably forming a second mask layer on the substrate;

performing an ion implantation twice at tilt angles on said second mask layer to define an undoped area between said two trench capacitors;

removing said undoped area of said second mask layer so that pad of the substrate is exposed to serve as the pre-determined location of the transistor gate;

forming a recess in the substrate corresponding to said undoped area;

removing the second mask layer;

making the first dielectric layer and the substrate at the same level;

forming a second dielectric layer over the bottom and sides of said recess;

filling said recess having has said second dielectric layer with a first conductive layer and make the first conductive layer and the substrate at the same level; and forming a second conductive layer on the first conductive layer, said second and first conductive layers together forming said transistor gate.

9. The method according to claim 8, wherein the forming of a recess in the substrate corresponding to said undoped area is performed by HBr etching.

10. The method according to claim 8, wherein the second dielectric layer is made of silicon oxide.

11. The method according to claim 8, wherein the conductive layers is made of polysilicon.

12. The method according to claim 8, wherein making the first dielectric layer and the first mask layer at the same level and making the first dielectric layer and the substrate at the same level are both implemented by chemical-mechanical polishing (CMP).

* * * * *

UNITED STATES PATENT AND TRADEMARK OFFICE
CERTIFICATE OF CORRECTION

PATENT NO.       : 7,588,984 B2                              Page 1 of 1
APPLICATION NO.  : 11/431588
DATED            : September 15, 2009
INVENTOR(S)      : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 553 days.

Signed and Sealed this

Twenty-first Day of September, 2010

David J. Kappos
*Director of the United States Patent and Trademark Office*